United States Patent
Farmer et al.

(10) Patent No.: US 8,932,919 B2
(45) Date of Patent: Jan. 13, 2015

(54) VERTICAL STACKING OF GRAPHENE IN A FIELD-EFFECT TRANSISTOR

(71) Applicant: International Business Machines Corporation, Armonk, NY (US)

(72) Inventors: Damon B. Farmer, White Plains, NY (US); Aaron D. Franklin, Croton on Hudson, NY (US); Sataoshi Oida, Yorktown Heights, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/683,148

(22) Filed: Nov. 21, 2012

(65) Prior Publication Data

US 2014/0138624 A1    May 22, 2014

(51) Int. Cl.
  *H01L 29/66* (2006.01)
  *H01L 21/336* (2006.01)
(52) U.S. Cl.
  CPC .... *H01L 29/6977* (2013.01); *H01L 29/66045* (2013.01)
  USPC ......... 438/186; 257/24; 257/27; 257/E29.068
(58) Field of Classification Search
  CPC ................... H01L 21/02527; H01L 21/23814; H01L 27/283; H01L 29/1606; H01L 29/78684; H01L 2924/01006
  See application file for complete search history.

(56) References Cited

U.S. PATENT DOCUMENTS

| | | | |
|---|---|---|---|
| 6,365,913 B1 | 4/2002 | Misewich et al. | |
| 7,772,059 B2 | 8/2010 | Parikh et al. | |
| 8,106,383 B2 | 1/2012 | Jenkins et al. | |
| 2011/0059599 A1 | 3/2011 | Ward et al. | |
| 2011/0101309 A1 | 5/2011 | Lin et al. | |
| 2011/0108802 A1 | 5/2011 | Lin et al. | |
| 2011/0114919 A1 | 5/2011 | Jenkins et al. | |
| 2011/0309334 A1 | 12/2011 | Chang et al. | |
| 2012/0032149 A1 | 2/2012 | Chen et al. | |
| 2012/0049160 A1* | 3/2012 | Sano et al. ...................... 257/27 |
| 2012/0056161 A1 | 3/2012 | Avouris et al. | |
| 2012/0175594 A1 | 7/2012 | Chen et al. | |
| 2012/0248416 A1 | 10/2012 | Zhou et al. | |
| 2012/0261643 A1 | 10/2012 | Cohen et al. | |

OTHER PUBLICATIONS

A. Badmaev, et al., "Self-Aligned Fabrication of Graphene RF Transistors with T-Shaped Gate," ACS Nano, vol. 6, No. 4, Mar. 10, 2012, pp. 3371-3376.
A. Franklin, et al., "Double Contacts for Improved Performance of Graphene Transistors," IEEE Electron Device Letters, vol. 33, Issue 1, Jan. 2012, pp. 17-19.

(Continued)

*Primary Examiner* — Zandra Smith
*Assistant Examiner* — Pamela E Perkins
(74) *Attorney, Agent, or Firm* — Cantor Colburn LLP; Vazken Alexanian

(57) ABSTRACT

A graphene field-effect transistor is disclosed. The graphene field-effect transistor includes a first graphene sheet, a first gate layer coupled to the first graphene sheet and a second graphene sheet coupled to the first gate layer opposite the first gate layer. The first gate layer is configured to influence an electric field within the first graphene sheet as well as to influence an electric field of the second graphene sheet.

19 Claims, 5 Drawing Sheets

(56) References Cited

OTHER PUBLICATIONS

I. Meric, et al., "Channel Length Scaling in Graphene Field-Effect Transistors Studied with Pulsed Current-Voltage Measurements," Nano Letters, vol. 11, No. 3, 2011, pp. 1093-1097.

Y. Wu, et al., "High-Frequency, Scaled Graphene Transistors on Diamond-Like Carbon," Nature, vol. 472, Apr. 7, 2011, pp. 74-78.
PCT International Search Report and Written Opinion; International Application No. PCT/US2013/054463; International Filing Date: Aug. 12, 2013; Date of Mailing: Jan. 29, 2014; pp. 1-13.

* cited by examiner

VERTICAL STACKING OF GRAPHENE IN A FIELD-EFFECT TRANSISTOR

BACKGROUND

The present invention relates to semiconductor electronics, and more specifically, to graphene field-effect transistors.

Graphene exhibits exceptional electronic properties such as a relative high carrier mobility and transconductance. These exceptional properties enable graphene to be used to form graphene field-effect transistors (GFETs), which may be useful in applications up to the terahertz frequency region. A typical GFET includes a source contact and a drain contact with a graphene sheet extending between them to form a gated channel. The GFET operates, in part, by modulating the conductance of the graphene sheet, usually via a gate contact metal proximate the graphene sheet. One of the leading challenges in GFET technology is that the intrinsic properties of the graphene are substantially compromised at the interfaces of the GFET, i.e., metal source/drain contacts, gate dielectrics, supporting substrates, etc. These interfaces produce sizable contact resistance, reduced carrier mobility due to scattering centers, and many other hindrances.

SUMMARY

According to one embodiment of the present invention, a graphene field-effect transistor includes: a first graphene sheet; a first gate layer coupled to the first graphene sheet configured to influence an electric field within the first graphene sheet; and a second graphene sheet coupled to the first gate layer opposite the first gate layer, wherein the first gate layer is configured to influence an electric field of the second graphene sheet.

According to another embodiment of the present invention, a gate region of a transistor includes: a plurality of alternating layers of gate layers and graphene sheets; and an electrical coupling between the gate layers.

According to another embodiment of the present invention, a transistor includes: a plurality of alternating layers of gate layers and graphene sheets; an electrical coupling device configured to couple the gate layers to each other; and at least one of a source contact and a drain contact, wherein the graphene sheets are configured to couple to the at least one of the source contact and the drain contact.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
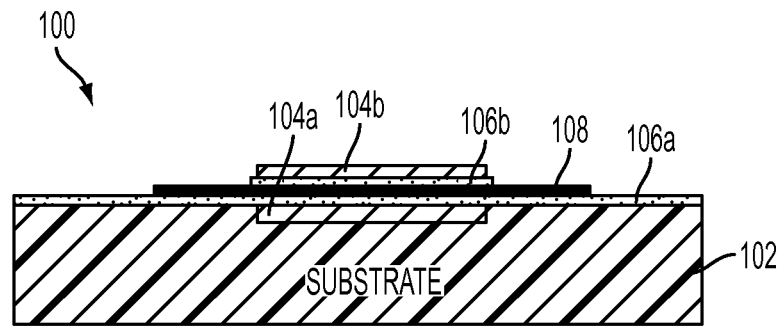
FIG. 1 shows an exemplary single layer of a gate region of an exemplary graphene field-effect transistor disclosed herein.

FIG. 1 shows an exemplary single layer of a gate region of an exemplary graphene transistor 100 disclosed herein. The gate region is formed on a substrate 102. Substrate 102 has a first gate contact metal 104a formed in a recess of the substrate 102 to form a substantially co-planar surface with the substrate 102. In exemplary embodiments, the substrate 102 is a silicon substrate. The gate contact metal 104a may be palladium or other suitable contact metal in exemplary embodiments. A dielectric layer 106a is formed on the surface of the substrate 102 and covers at least a portion of the gate contact metal 104a. The dielectric layer 106a may include hafnium oxide ($HfO_2$), $Al_2O_3$ or other suitable dielectric material. A graphene sheet 108 is disposed on the dielectric layer 106. The graphene sheet 108 extends between regions of the substrate 102 that are on opposite sides of the gate contact metal 104a. A second dielectric layer 106b is formed on top of the graphene sheet 108 and a second gate contact metal 104b is formed on top of the second dielectric layer 106b. Therefore, the exemplary single layer 100 includes a graphene sheet 108 surrounds to gate contact metals 104a and 104b at opposing surfaces of the graphene sheet 108 and separated from the gate contact metals 104a and 104b via dielectric layers 106a and 106b, respectively. The gate contact metals 104a and 104b may be electrically coupled via electrical wires or other suitable electrical coupling device or method. These gate contact metals 104a and 104b are therefore responsive to a same applied voltage, and the conductance of the graphene sheet 108 may be modulated via a voltage applied at both surfaces (i.e., top and bottom surfaces) of the graphene sheet 108.

Figure 2:
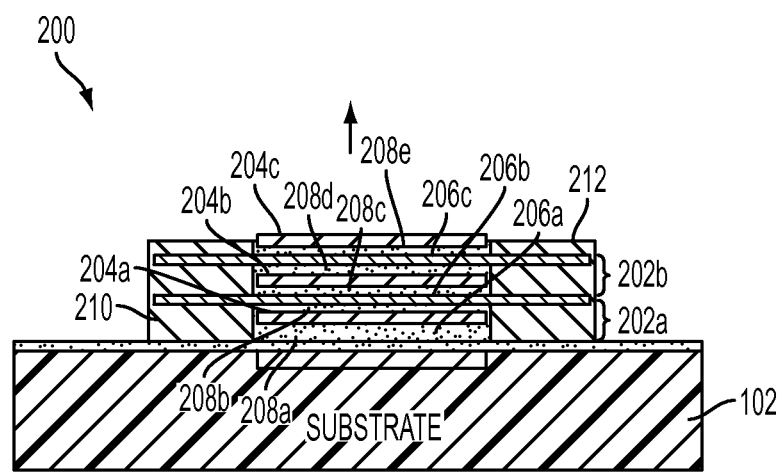
FIG. 2 shows an exemplary graphene field-effect transistor that includes multiple stacked graphene sheets.

FIG. 2 shows an exemplary GFET 200 that includes multiple stacked graphene sheets 206a, 206b and 206c. The exemplary GFET 200 includes a plurality of graphene sheets 206a, 206b and 206c stacked on top of each other with interleaving gate layers 202a and 202b on a substrate 102 to form a gate region. The height of the gate region is related to the number of graphene sheets 206a, 206b and 206c. The graphene sheets 206a, 206b and 206c extend between a source contact 210 and a drain contact 212 and provide multiple parallel gate channels between the source contact 210 and drain contact 212. Three graphene sheets 206a, 206b and 206c are shown in FIG. 2 for illustrative purposes. However, it is understood that a GFET formed using the methods disclosed herein may have any number of graphene sheets. The number of graphene sheets may affect various transistor parameters, such as drain current and/or transconductance, for example. Thus, the number of graphene sheets may be selected to form a GFET having a parameter that is within a selected criterion. It is also understood that the number of gate layers may be increased without increasing the footprint of the transistor, i.e., the surface area of the substrate taken up by the transistor.

In the exemplary multiple-gate GFET 200, the plurality of graphene sheets 206a, 206b and 206c may be separated by interleaved gate layers such as exemplary gate layers 202a and 202b. Gate layer 202a includes a gate contact metal 204a that is sandwiched between a dielectric material 208a on one side of the gate contact metal 204b and a dielectric material 208b on an opposing side of the gate contact metal 204b. In exemplary embodiments, the dielectric materials 208a and 208b are the same material. Similarly, gate layer 202b includes gate contact metal 204b sandwiched between dielectric material 208c and dielectric material 208d. Top graphene sheet 206c is covered by dielectric layer 208e and gate contact metal 204c. Thus, each graphene sheet is surrounded by gate contact metal at each surface. In exemplary embodiments, the gate layers 202a and 202b may be electrically coupled to each other. In particular, the gate contact metals 240a, 204b and 204c may be electrically coupled to each other. The coupled gate contact metals 204a, 204b and 204c may thus be coupled to a same voltage source. Thus, a uniform voltage may be applied through each of the gate contact metals 240a, 204b and 204c. A voltage applied to a gate contact metal such as gate contact metal 204b alters an electric field in its adjacent graphene sheets, i.e., graphene sheets 206b and 206c. Additionally, a selected graphene sheet such as graphene sheet 206b may have its internal electric field affected by voltage applied at its adjacent gate contact metals, i.e., gate contact metals 204a and 204b.

Figure 3:
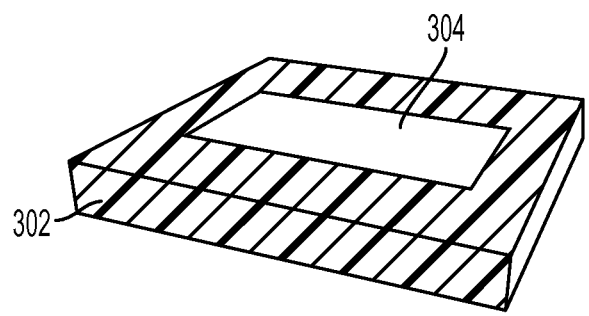
FIG. 3 shows a first manufacturing stage of an exemplary graphene field-effect transistor in which a sheet of graphene is disposed on a substrate.

FIGS. 3-8 show exemplary stages for manufacturing the multi-layer graphene field-effect transistor 200 shown in FIG. 2. FIG. 3 shows a first manufacturing stage of the GFET 200 in which a sheet of graphene 304 is disposed on a substrate 302, such as a silicon dioxide substrate. The substrate is typically 1 micrometer (μm) in thickness. The graphene sheet 304 may be grown independently using, for example, chemical vapor deposition (CVD) of the graphene on a copper foil and then transferred onto the silicon substrate 302. A resist (not shown) may then be formed on the graphene sheet 304 and the silicon substrate 102 to protect a segment of the initial graphene sheet from lithographic process that patterns the graphene sheet for the active transistor device. In an exemplary embodiment, the resist may include a bilayer resist of hydrogen silsesquioxiane (HSQ 2%) on poly(methylmethacrylate) (PMMA). Electron beam lithography (EBL) may then be used to pattern the bilayer resist to form a mask. A reactive ion etch may be used to remove graphene in the exposed region. The etching process leaves the graphene sheet 304 as shown in the FIG. 3.

Figure 4:
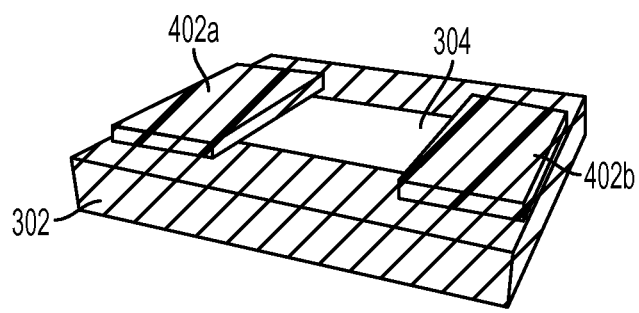
FIG. 4 shows a second stage of the manufacturing process in which source and drain contacts are formed.

FIG. 4 shows a second stage of the manufacturing process in which source and drain contacts are formed. Source 306a and drain 306b may be formed by forming a resist layer on the substrate, using electron beam lithography on the resist layer to expose a region. A metal is then deposited in the exposed region to form the source 306a and the drain 306b using, for example, atomic layer deposition. The source 306a and drain 306b are formed so as to be electrically coupled to the graphene sheet 304. In an exemplary embodiment, the metal used in the source 306a and drain 306b is palladium (Pd), although any suitable metal may be used. In an exemplary embodiment, the thickness of the source 306a and drain 306b is about 30 nanometers (nm), although any suitable thickness may be used. After the atomic layer deposition of the source 306a and drain 306b, the resist layer is lifted off of the substrate using, for example, hot acetone.

Figure 5:
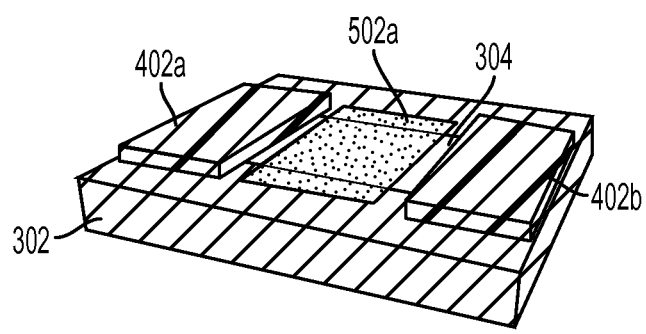
FIG. 5 shows a third stage of the manufacturing process in which a dielectric layer is formed on the graphene sheet of FIG. 3.

FIG. 5 shows a third stage of the manufacturing process in which a dielectric layer 502a is formed on the graphene sheet 304. The dielectric layer 502a may be formed by a method of resist deposition, lithography, atomic layer deposition of a dielectric material and resist take off. In an exemplary embodiment, electron beam lithography is used to pattern a region of the exposed graphene 304. After the region is exposed, trimethylaluminum (TMA) and water precursors in $NO_2$ may be deposited on the graphene sheet to form a seed layer. In an exemplary embodiment, the TMA and water precursor in $NO_2$ are deposited over a 10 cycle deposition process. Once the seed layer is formed, atomic layer deposition may be used to form a dielectric layer of hafnium oxide ($HfO_2$), $Al_2O_3$ or other suitable high-k dielectric material. In an exemplary embodiment, the dielectric layer has a thickness of about 10 nm.

Figure 6:
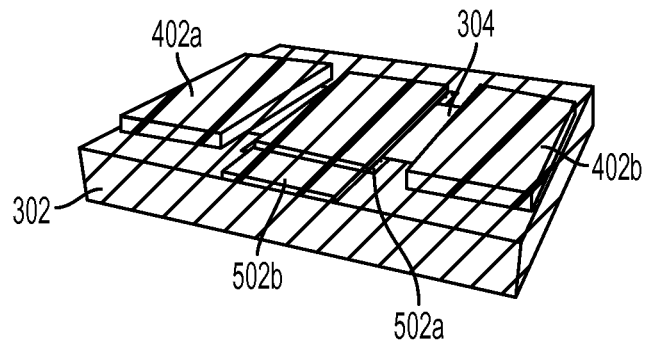
FIG. 6 shows a fourth stage of the manufacturing process in which a gate contact metal is formed on the dielectric layer of FIG. 5.

FIG. 6 shows a fourth stage of the manufacturing process in which gate contact metal 502b is formed on the dielectric layer 502a of FIG. 5. The gate layer 502b may be formed by resist deposition, lithography, atomic layer deposition of the gate contact metal and resist take-off using hot acetone. In an exemplary embodiment, the metal of the gate contact metal 502b may be palladium or other suitable contact material. In an exemplary embodiment, the gate contact metal 502b has a thickness of about 10 nm. The transistor that is formed after this fourth stage is equivalent to a top-gated graphene FET. This top-gated graphene FET may be tested after the fourth stage and before continuing the manufacturing process.

Figure 7:
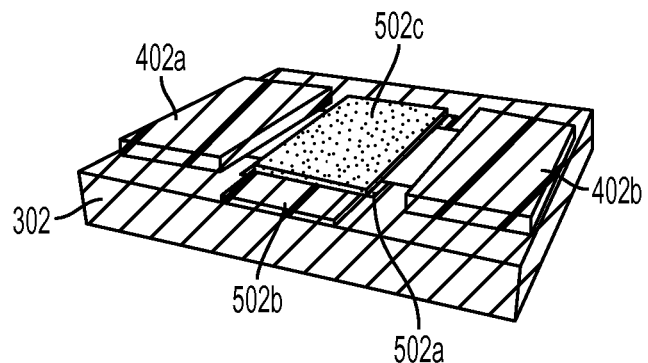
FIG. 7 shows a fifth stage of the manufacturing process in which a second dielectric layer is deposited on the gate contact metal of FIG. 6.

FIG. 7 shows a fifth stage of the manufacturing process in which a second dielectric layer 502c is deposited on the gate contact metal 502b of FIG. 6. Deposition of the second dielectric layer 502c completes formation of a gate layer of the multi-level graphene FET, such as exemplary gate layer 102a. The process for forming the second dielectric layer is similar to the process of forming the first dielectric layer shown in FIG. 5. The second dielectric layer may include hafnium oxide or other suitable dielectric material. In an exemplary embodiment, the second dielectric layer 502c has a thickness of about 10 nm.

The gate layer 102a thus comprises first dielectric layer 502a having a thickness of 10 nm, gate contact metal 502b having a thickness of 10 nm and second dielectric layer 502c having a thickness of 10 nm. Therefore, the thickness of the gate layer 102 is approximately 30 nm and is the same thickness as the source 402a and drain 402b. The top surfaces of the gate layer 102a, the source 402a and the drain 402b therefore form substantially coplanar surfaces that may be used for further graphene sheet deposition and transistor growth.

Figure 8:
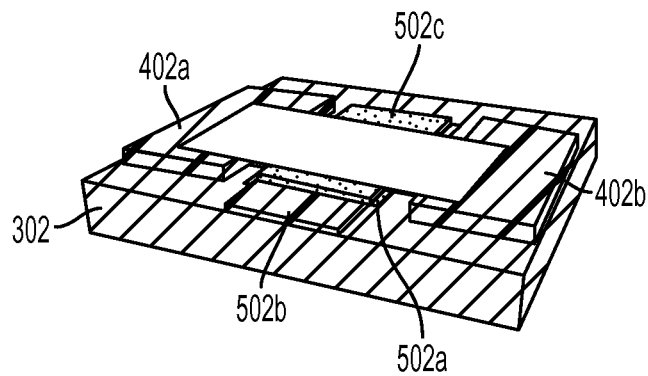
FIG. 8 shows a sixth stage of the manufacturing process in which a second graphene sheet of the graphene field-effect transistor is formed.

FIG. 8 shows a sixth stage of the manufacturing process in which a second graphene sheet 804 of the GFET 200 is formed. The second graphene sheet 804 may be formed using the same process as the first graphene sheet of FIG. 1. In other words, a CVD-grown graphene material is deposited on the surfaces provided by the gate layer 102, the source 402a and drain 402b and etched to a selected dimension to provide the second graphene sheet 804. The second graphene sheet 804 is formed so as to be electrically coupled to the source 306a and the drain 306b. At the end of the sixth stage, there are two independent, vertically stacked graphene sheets 304 and 804 that are gated by the same gate contact metal 503b and in contact with the same source 402a and same drain 404b. The presence of the second graphene sheet 804 enhances a performance characteristic of the GFET while maintaining a footprint of the GFET at the substrate, i.e., without increasing the surface area required by the GFET at the substrate 102.

Figure 9:
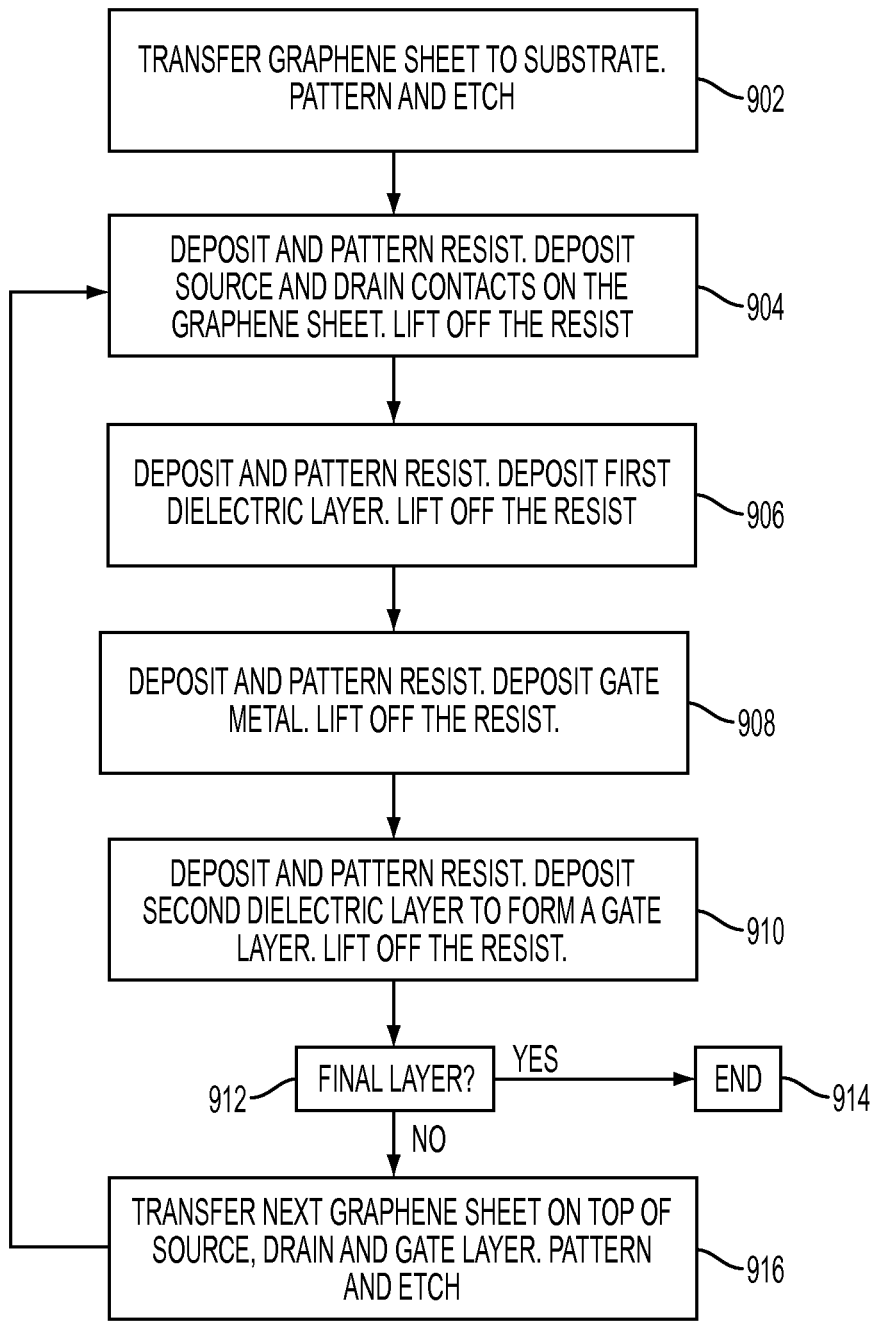
FIG. 9 shows a flowchart illustrating an exemplary method of forming the graphene field-effect transistor of the present invention.

FIG. 9 shows a flowchart 900 illustrating an exemplary method of forming the graphene FET of the present invention. In block 902, a graphene sheet is transferred to a substrate and patterned and etched to form a first graphene sheet of the GFET that provide a gate channel of the GFET. In block 904, source and drain contacts are formed on the first graphene sheet. In an exemplary embodiment, a resist is deposited and patterned. Metals are then deposited in the patterned area of the resist to form the source and drain contacts and the resist is lifted off. In block 906, the first dielectric layer is formed on the first graphene sheet. In an exemplary embodiment, a resist is deposited and patterned to expose and area of the first graphene sheet. A dielectric material is deposited in the patterned area of the resist to form the first dielectric layer and the resist is lifted off. In block 908, a gate contact metal is deposited on the first dielectric layer. In an exemplary embodiment, a resist is deposited and patterned to expose the first dielectric layer. The gate contact metal is then deposited on the exposed first dielectric layer and the resist is lifted off. In block 910, a second dielectric layer is deposited on the gate contact metal formed in block 908. In an exemplary embodiment, a resist is deposited and patterned to expose at least a portion of the gate contact metal. A dielectric material is deposited on the exposed portion of the gate contact metal to form the second dielectric layer and the resist is lifted off. At this point an operable gate channel has been completed. Therefore, in block 912, an operator determines whether the most recently completed gate channel is the last gate channel of the GFET to be formed. This decision is generally based on a design specification selected by the operator. If this is the final gate channel, the process proceeds to block 914 where it ends. Otherwise, a second graphene sheet is transferred to the substrate to lie on top of the gate channel formed in blocks 906, 908 and 910 as well as on top of the source and drain contacts formed in block 904. This second graphene sheet forms a second gate channel of the GFET parallel to the first gate channel. From block 916, the process returns to block 904 and more layers are deposited to form the next layer of gate channels. This process may be continued to form any number of gate channels. Once the final gate channel is completed, the gate contact metals may be electrically coupled using, for example, a wire connection or bonding method.

Figure 10:
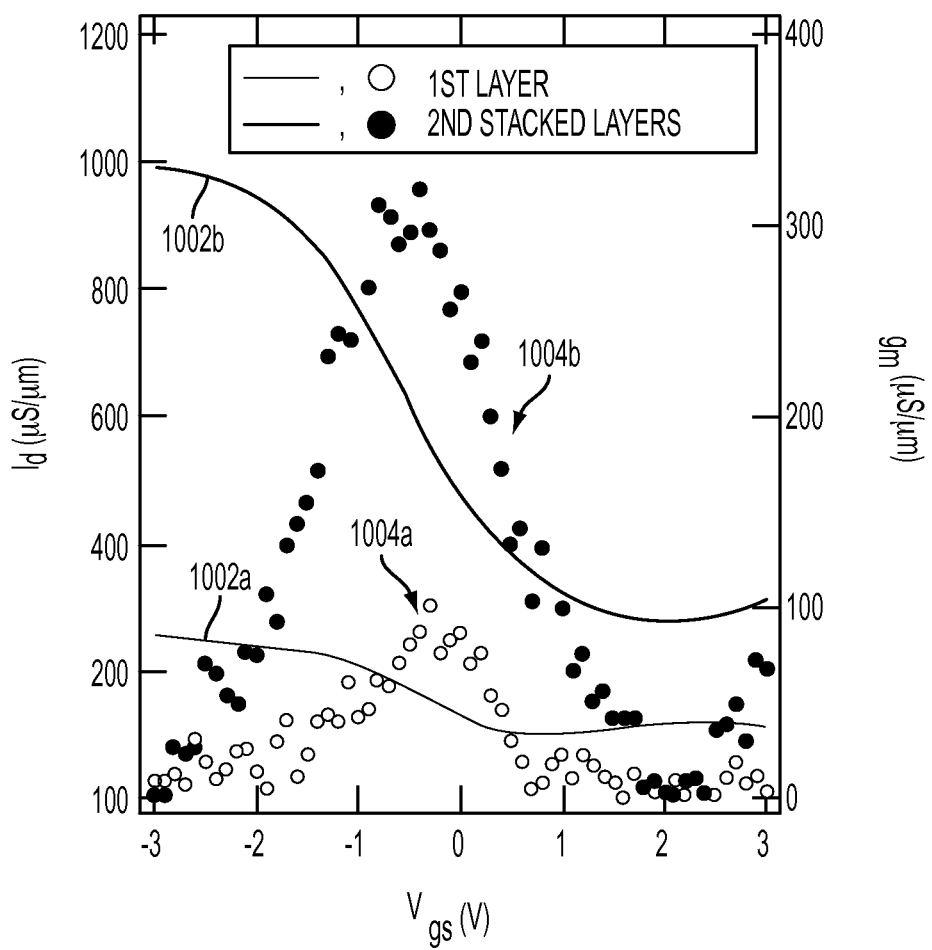
FIG. 10 shows an exemplary graph illustrating the effect of multiple graphene sheets on various parameters of the exemplary graphene field-effect transistor of the present invention.

FIG. 10 shows an exemplary graph illustrating the effect of multiple graphene sheets on various parameters of the exemplary GFET of the present invention. The gate-source voltage is shown along the x-axis in volts. Drain current ($I_d$) is shown along the left-side y-axis as measured in microamps per micrometer. Transconductance is shown along the right-side y-axis as measured in microsiemens per micrometer. Drain current 1002a represents the drain current for an exemplary single-layer GFET of the present invention. Drain current 1002b represents the drain current for an exemplary double-layer GFET of the present invention. Clearly, the drain current 1002b of the double-layer GFET is increased over the drain current 1002a of the single-layer GFET. Transconductance 1004a represents the transconductance for the exemplary single-layer GFET. Transconductance 1004b represents the transconductance for the exemplary double-layer GFET. The transconductance 1004b of the double-layer GFET is increased over the transconductance 1004a of the single-layer GFET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a graphene field-effect transistor, comprising:
    forming a first graphene sheet on a substrate;
    depositing a first gate layer on a top surface of the first graphene sheet, wherein the first gate layer influences an electric field of the first graphene sheet;
    depositing at least one of a source contact and a drain contact on atoll the top surface of the first graphene sheet; and
    depositing a second graphene sheet on top surfaces of the first gate layer and the at least one of the source contact and the drain contact, wherein the first gate layer influences an electric field of the second graphene sheet.

2. The method of claim 1, further comprising depositing a second gate layer on a top surface of the second graphene sheet and electrically coupling the first gate layer and the second gate layer.

3. The method of claim 2 wherein an electric field in the second graphene sheet is influenced using both of the first gate layer and the second gate layer.

4. The method of claim 1, wherein the first gate layer further comprises a gate contact metal sandwiched between dielectric layers.

5. The method of claim 1, wherein a thickness of the gate layer is substantially the same as the thickness of the at least one of the source contact and the drain contact.

6. The method of claim 1, further comprising stacking alternating layers of graphene sheets and gate layers to obtain a selected state of a parameter of the transistor.

7. A method of forming a gate region of a transistor, comprising:
   depositing a first gate layer and at least one of a source contact and a drain contact on the top surface of the first graphene sheet;
   depositing a second graphene sheet on top surfaces of the first gate layer and the at least one of the source contact and the drain contact;
   forming a second gate layer on a top surface of the second graphene sheet; and
   electrically coupling the first and second gate layers to each other to form the gate region of the transistor.

8. The method of claim 7 further comprising forming the first graphene sheet on a substrate.

9. The method of claim 8 wherein a footprint of the transistor on flail the substrate is independent of the number of alternating layers.

10. The method of claim 7, further comprising stacking a plurality of alternating layers of gate layers and graphene sheets so that an electric field in a selected graphene sheet is affected by gate layers on opposite sides of the selected graphene sheet.

11. The method of claim 10 further comprising selecting the number of alternating layers to obtain a selected state of a transistor parameter.

12. The method of claim 7, further comprising coupling the source contact and the drain contact to the first graphene sheet and the second graphene sheet.

13. The method of claim 7 wherein a selected gate layer includes a gate contact metal sandwiched between dielectric layers.

14. A method of forming a transistor, comprising:
   depositing a first gate layer and at least one of a source contact and a drain contact on the top surface of the first graphene sheet;
   depositing a second graphene sheet on top surfaces of the first gate layer and the at least one of the source contact and the drain contact;
   forming a second gate layer on a top surface of the second graphene sheet; and
   electrically coupling the first and second gate layers to each other.

15. The method of claim 14 further comprising forming the first graphene sheet on a substrate.

16. The method of claim 14, further comprising stacking a plurality of layers so that an electric field in a selected graphene sheet is affected by gate layers on opposite sides of the selected graphene sheet.

17. The method of claim 14 wherein a selected gate layer includes a gate contact metal sandwiched between insulator material.

18. The method of claim 14, wherein a thickness of the gate layer is substantially the same as the thickness of the at least one of the source contact and the drain contact.

19. The method of claim 14 further comprising selecting a number of alternating layers to obtain a selected state of a transistor parameter.

* * * * *